United States Patent

Tomita et al.

[11] Patent Number: 4,765,919
[45] Date of Patent: Aug. 23, 1988

[54] PIEZOELECTRIC CERAMIC MATERIALS

[75] Inventors: Masahiro Tomita, Anjo; Eturo Yasuda; Hirosi Matuoka, both of Okazaki, all of Japan

[73] Assignee: Nippon Soken, Inc., Nishio, Japan

[21] Appl. No.: 946,163

[22] Filed: Dec. 23, 1986

Related U.S. Application Data

[63] Continuation of Ser. No. 810,226, Dec. 17, 1985, abandoned.

[30] Foreign Application Priority Data

Dec. 17, 1984 [JP] Japan .................. 59-265603

[51] Int. Cl.$^4$ .................. C04B 35/46; C04B 35/48; C04B 35/49
[52] U.S. Cl. .................. 252/62.9; 501/134
[58] Field of Search .................. 252/62.9; 501/134

[56] References Cited

U.S. PATENT DOCUMENTS

| | | | |
|---|---|---|---|
| 2,911,370 | 11/1959 | Kulcsar | 252/62.9 |
| 3,468,799 | 9/1969 | Kurihara et al. | 252/62.9 |
| 3,594,321 | 7/1971 | Ohno et al. | 252/62.9 |
| 3,630,909 | 12/1971 | Banno et al. | 252/62.9 |
| 3,956,150 | 5/1976 | Ouchi et al. | 252/62.9 |
| 3,998,748 | 12/1976 | Nishida et al. | 252/62.9 |
| 4,224,174 | 9/1980 | Okuma et al. | 252/62.9 R |
| 4,313,839 | 2/1982 | Fesenko et al. | 252/62.9 |
| 4,675,123 | 6/1987 | Tsunooka et al. | 252/62.9 |

FOREIGN PATENT DOCUMENTS 45-14465  5/1970  Japan .

OTHER PUBLICATIONS

Piezoelectric Ceramics, B. Jaffe, et al., pp. 152 & 201, Academic Press, London, 1971.

Primary Examiner—William R. Dixon, Jr.
Assistant Examiner—Andrew B. Griffis
Attorney, Agent, or Firm—Cushman, Darby & Cushman

[57] ABSTRACT

A piezoelectric ceramic material composed of a ternary solid solution of $Pb(Ni_{\frac{1}{3}}Nb_{\frac{2}{3}})O_3$ - $PbTiO_3$ - $PbZrO_3$ having the composition within an area encircled by lines connecting points A(15 mol % of $Pb(Ni_{\frac{1}{3}}Nb_{170})O_3$, 45 mol % of $PbTiO_3$ and 40 mol % of $PbZrO_3$); F(40 mol % of $Pb(Ni_{166}Nb_{\frac{2}{3}})O_3$, 30 mol % of $PbTiO_3$ and 30 mol % of $PbZrO_3$), C(51 mol % of $Pb(Ni_{\frac{1}{3}}Nb_{\frac{2}{3}})O_3$, 24 mol % of $PbTiO_3$ and 25 mol % of $PbZrO_3$), G(45 mol % of $Pb(Ni_{\frac{1}{3}}Nb_{\frac{2}{3}})O_3$, 35 mol % of $PbTiO_3$ and 20 mol % of $PbZrO_3$), H(40 mol % of $Pb(Ni_{\frac{1}{3}}Nb_{170})O_3$, 40 mol % of $PbTiO_3$, and 20 mol % of $PbZrO_3$) and I(30 mol % of $Pb(Ni_{\frac{1}{3}}Nb_{\frac{2}{3}})O_3$, 45 mol % of $PbTiO_3$ and 25 mol % $PbZrO_3$). And at least one additive selected from the group consisting of $Sb_2O_3$, $Nb_2O_5$, $Bi_2O_3$, $La_2O_3$, $WO_3$ is added to the ternary solid solution in an amount of 0.1 to 1.0 weight % of the ternary solid solution.

10 Claims, 1 Drawing Sheet

U.S. Patent  Aug. 23, 1988  4,765,919
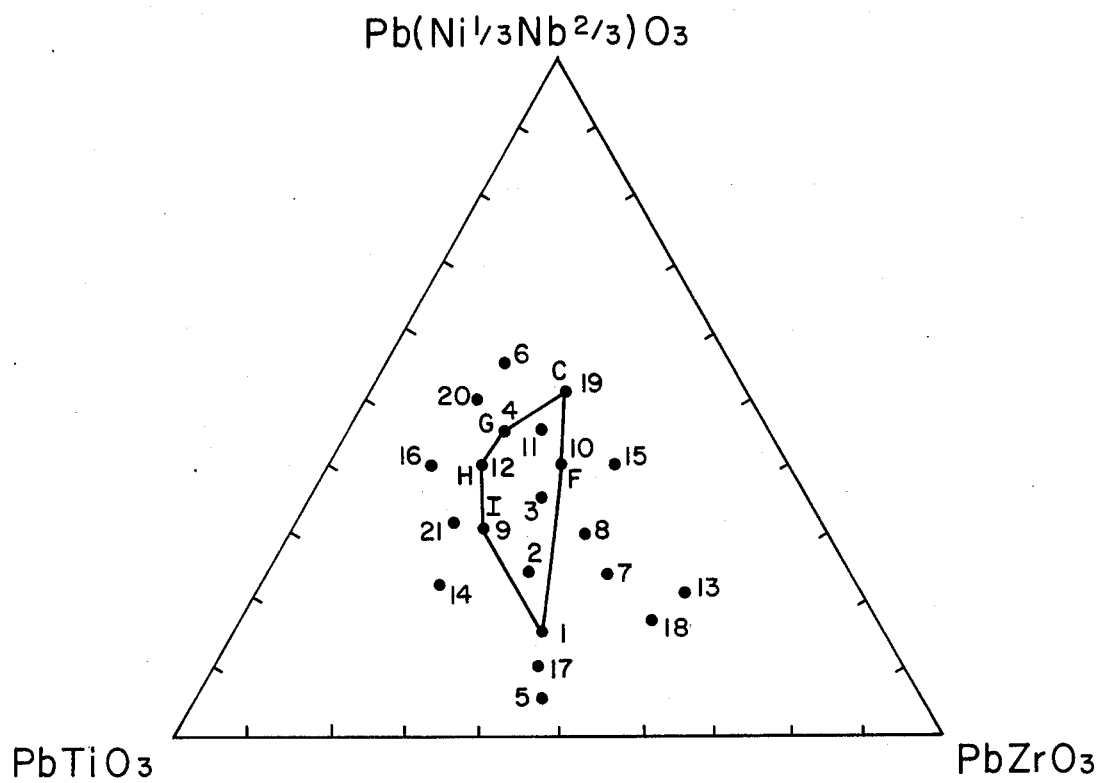

PIEZOELECTRIC CERAMIC MATERIALS

This is a continuation of application Ser. No. 810,226, filed Dec. 17, 1985 which was abandoned upon the filing hereof.

BACKGROUND OF THE INVENTION

1. Field of the Invention

The invention relates to piezoelectric ceramic materials which are effectively utilizable in various types of actuators and which are composed of ternary solid solutions having a fundamental composition of $Pb(Ni_{\frac{1}{3}}Nb_{\frac{2}{3}})O_3$-$PbTiO_3$-$PbZrO_3$.

2. Description of the Prior Art

Piezoelectric ceramic materials used in actuators should have various characteristics such as a high piezoelectric constant, a high Curie point and high mechanical strength. One of piezoelectric materials which have been most widely used at present is a piezoelectric ceramic material composed of a ternary solid solution of $Pb(Ni_{\frac{1}{3}}Nb_{\frac{2}{3}})O_3$-$PbTiO_3$-$PbZrO_3$. Many studies have been made on the above ceramic material in order to further improve the characteristics mentioned above. For instance, in order to improve the mechanical strength, there were proposed ceramic materials in Japanese Examined Patent Publication No. Sho 46-43062 in which a small amount of $ZrSiO_4$ was added to the ternary solid solution of $Pb(Ni_{\frac{1}{3}}Nb_{\frac{2}{3}})O_3$-$PbTiO_3$-$PbZrO_3$.

The improvement in strength of piezoelectric ceramic materials is needed especially when thin plates of piezoelectric ceramic materials are used in ultrasonic transducer elements or circuit elements. However, when this plates of piezoelectric materials are laminated for use as actuators, it is desirable to increase a degree of displacement of piezoelectric ceramic materials upon application of an electric field by increasing the piezoelectric constant of the materials rather than to improve the mechanical strength thereof.

SUMMARY OF THE INVENTION

It is accordingly an object of the present invention to provide piezoelectric ceramic materials composed of ternary solid solutions having a fundamental composition of $Pb(Ni_{\frac{1}{3}}Nb_{\frac{2}{3}})O_3$-$PbTiO_3$-$PbZrO_3$ and having largely improved piezoelectric constants.

The piezoelectric ceramic material of the present invention is composed of a ternary solid solution of $Pb(Ni_{\frac{1}{3}}Nb_{\frac{2}{3}})O_3$-$PbTiO_3$-$PbZrO_3$ having the composition within an area encircled by lines connecting points A(15 mol% of $Pb(Ni_{\frac{1}{3}}Nb_{\frac{2}{3}})O_3$, 45 mol% of $PbTiO_3$ and 40 mol% of $PbZrO_3$), F(40 mol% of $Pb(Ni_{\frac{1}{3}}Nb_{\frac{2}{3}})O_3$, 30 mol% of $PbTiO_3$ and 30 mol% of $PbZrO_3$), C(51 mol% of $Pb(Ni_{\frac{1}{3}}Nb_{\frac{2}{3}})O_3$, 24 mol% of $PbTiO_3$ and 25 mol% of $PbZrO_3$), G(45 mol% of $Pb(Ni_{\frac{1}{3}}Nb_{\frac{2}{3}})O_3$, 35 mol% of $PbTiO_3$ and 20 mol% of $PbZrO_3$), H(40 mol% of $Pb(Ni_{\frac{1}{3}}Nb_{\frac{2}{3}})O_3$, 40 mol% of $PbTiO_3$ and 20 mol% of $PbZrO_3$) and I(30 mol% of $Pb(Ni_{\frac{1}{3}}Nb_{\frac{2}{3}})O_3$, 45 mol% of $PbTiO_3$, and 25 mol% of $PbZrO_3$). And at least one additive selected form the group consisting of $Sb_2O_3$, $Nb_2O_5$, $Bi_2O_3$, $La_2O_3$, $WO_3$ is added to the ternary solid solution in an amount of 0.1 to 1.0 weight% of the ternary solid solution.

The piezoelectric ceramic materials according to the present invention have a piezoelectric constant as high as about $450 \times 10^{-12}$ to $600 \times 10^{-12}$ m/V. Upon application of an electric field, a great degree of displacement can be obtained, so that the piezoelectric ceramic materials of the invention can be effectively utilized as piezoelectric materials for various actuators such as of injectors for internal combustion engines of vehicles.

Furthermore, the piezoelectric ceramic materials according to the present invention have a sintered density of about 7.70 g/cm$^3$ or more and a curie temperature of about 160° C. or more so that sufficiently large mechanical strength and good heat resistance can be obtained.

BRIEF DESCRIPTION OF THE DRAWING

The drawing is a triangular compositional diagram of the fundamental composition of the piezoelectric ceramic materials.

DETAILED DESCRIPTION OF THE EMBODIMENT

The piezoelectric ceramic materials of the present invention are prepared, for example, by powdered metal techniques. More particularly, starting materials for these ceramic materials such as PbO, $TiO_2$, $ZrO_2$, NiO, $Nb_2O_5$, $Sb_2O_3$, $Bi_2O_3$, $TaO_3$, $La_2O_3$, $WO_3$ and the like are weighed in predetermined ratios and mixed such as in a wet ball mill. The resulting mixture is dried, calcined at temperatures of 700° to 900° C. for 3 to 10 hours and again mixed in the wet ball mill. After drying, there is obtained an intended powder.

To the powder obtained above is added a binder such as water or polyvinyl alcohol, followed by press molding under pressure of 300 to 1000 Kg/cm$^2$ and sintering at a temperature of 1200° to 1300° C. for 1 to 3 hours to obtain moldings of a columnar form having a diameter of 5 mm and a length of 8 mm.

The columns are polished on the surfaces thereof, after which electrodes are formed at opposite side ends thereof by a known method. The electrode-formed column is placed in an insulating oil such as silicon oil of 20° to 100° C. and a D.C. electric field of 20 to 30 KV/cm is applied across the electrodes for 6 to 60 minutes for polarization. Thereafter, the polarized column is aged at 120° C. for 1 hour and cooled down to normal temperatures to obtain a sample for measurement.

The piezoelectronic constant $d_{33}$ of the sample is determined according to the following equation (1), in which $k_{33}$, $\epsilon_{33}$ and $S_{33}$ are obtained according to the equations (2) (3) and (4), respectively.

$$d_{33} = k_{33}\sqrt{\epsilon_{33} \cdot S_{33}} \quad (1)$$

$$1/(k_{33})^2 = 0.405 \times fr/(fa-fr) + 0.81 \quad (2)$$

$$\epsilon_{33} = C \times l/S \quad (3)$$

$$1/S_{33} = 4\rho \cdot fa^2 \cdot l^2(1-k_{33}^2) \quad (4)$$

in which l is a length (m) of the sample, S is an area (m$^2$) of the end surface of the sample, C is an electrostatic capacitance (F) when measured at 1 KHz by the use of a LCR meter, $\rho$ is a density (Kg/m$^3$), and fa and fr are, respectively, antiresonance and resonance frequencies (Hz). These are measured by known methods, respectively. And $k_{33}$ is an electromechanical coupling coefficient.

Table shows the contents and characteristics of samples made in the procedure as described above.

In Examples 1 to 6, the content of Pb(Ni$_\frac{1}{3}$Nb$_\frac{2}{3}$)O$_3$ is intentionally changed.

As the content of Pb(Ni$_\frac{1}{3}$Nb$_\frac{2}{3}$)O$_3$ is increased, the obtained piezoelectric constant is increased, the sintered density becomes large and the mechanical strength is also improved, but the curie temperature is decreased.

In this case, Examples 5 and 6 are excluded from the ceramic materials according to the present invention since Example 5 exhibits too small piezoelectric constant and Example 6 exhibits too low curie temperature.

In Examples 7 through 16, the content of each of PbTiO$_3$ and PbZrO$_3$ is intentionally changed and accordingly the content of Pb(Ni$_\frac{1}{3}$Nb$_\frac{2}{3}$)O$_3$ is also changed.

In Examples, 2, 7, 13 and 14 of which the content of Pb(Ni$_\frac{1}{3}$Nb$_\frac{2}{3}$)O$_3$ is substantially the same as one another, the piezoelectric constant is lowered as the difference between the content of PbTiO$_3$ and PbZrO$_3$ is increased (Examples 13 and 14). So, Examples 13 and 14 are excluded from the ceramic materials according to the present invention.

And as compared with Examples 10 and 12, in Examples 15 and 16, the sintered density, or the piezoelectric constant becomes lower. So, Examples 15 and 16 are excluded from the ceramic materials according to the present invention.

Examples 17 through 21 of which the composition is largely changed from one another exhibit desirable results on the sintered density, the piezoelectric constant and the curie temperature.

The attached triangular compositional diagram shows the composition of each of Examples 1 through 21.

As is clear from the triangular compositional diagram, the compositions of Examples 1 through 4 and 9 through 12, each exhibiting desirable sintered density and curie temperature and a large piezoelectric constant of not less than about $450 \times 10^{-12}$ m/V, exist within the area encircled by lines connecting points A, F, C, G, H and I which correspond to the compositions of Examples 1, 10, 19, 4, 12 and 9, respectively.

And Examples 5, 6, 13 through 16 excluded from the ceramic materials according to the present invention exist outside this area.

In Examples 22 to 26, the basic composition of each Example is the same as that of Example 2 and the content of Sb$_2$O$_3$ as an additive is changed.

When the content of Sb$_2$O$_3$ is too small, sufficiently large sintered density cannot be obtained (Example 25) and when the content of Sb$_2$O$_3$ is too large, the piezoelectric coefficient is lowered (Example 26).

These data show that the preferable content of Sb$_2$O$_3$ is 0.1 to 1.0 weight%.

And the piezoelectric constant has a peak value when the content of Sb$_2$O$_3$ is in the vicinity of 0.5 weight% (Example 2).

When the content of Sb$_2$O$_3$ is over 0.5 weight%, the added Sb$_2$O$_3$ is not completely dissolved in the solid solution but part of the added Sb$_2$O$_3$ is separated from the solid solution. This results in the piezoelectric constant being lowered.

In Examples 27 through 39, other additives than Sb$_2$O$_3$ are employed in the amount of 0.5 to 0.6 weight%.

When one of additives for soft materials such as Nb$_2$O$_5$, Bi$_2$O$_3$, La$_2$O$_3$ and WO$_3$, a mixture of these additives or a mixture of these additive and Sb$_2$O$_3$ is employed, the desirable sintered density, curie temperature and piezoelectric constant can be obtained (Examples 27 through 37). But when additives for hard materials, such as MnO$_2$, and Fe$_2$O$_3$ is employed, sufficiently large piezoelectric constants cannot be obtained (Examples 38 and 39).

From the above experimental results it is clear that the ceramic materials composed of ternary solid solutions of Pb(Ni$_\frac{1}{3}$Nb$_\frac{2}{3}$)O$_3$-PbTiO$_3$-PbZrO$_3$ having the compositions within the area encircled by the lines connecting points A, F, C, G, H and I in a triangular compositional diagram, and including 0.1 to 1.0 weight% of at least one kind of additive selected from the group consisting of Sb$_2$O$_3$, Nb$_2$O$_5$, Bi$_2$O$_3$, La$_2$O$_3$ and WO$_3$ have excellent mechanical strength and a high curie temperature, and an especially desirable piezoelectric constant.

When the content of Pb(Ni$_\frac{1}{3}$Nb$_\frac{2}{3}$)O$_3$ is constant and the content of PbTiO$_3$ and PbZrO$_3$ is outside the above described area, desired piezoelectric constants cannot be obtained due to the decrease in sintered density and specific inductive capacity. (Examples 13, 14, 15 and 16).

When the content of Pb(Ni$_\frac{1}{3}$Nb$_\frac{2}{3}$)O$_3$ is increased, the sintered density and the piezoelectric constant become larger but the curie temperature remarkably drops (Example 6).

When the content of Pb(Ni$_\frac{1}{3}$Nb$_\frac{2}{3}$)O$_3$ is decreased, the sintered density becomes smaller and the mechanical strength is lowered (Example 5).

When the content of the above described additives is not more than 0.1 weight%, the sintered density becomes small (Example 25) and when not less than 2.0 weight%, part of the additives separates from the solid solution. This results in the electromechanical coupling coefficient $k_{33}$ being decreased and accordingly the piezoelectric constant being lowered (Example 26).

The piezoelectric materials having the above described properties can be suitably used as the materials for actuators.

TABLE

| Sample No. | X (mol %) | Y (mol %) | Z (mol %) | C | (weight %) | Sintered Density (g/cm$^3$) | Specific Inductive Capacity | Piezo-electric Constant ($\times 10^{-12}$ m/V) | Curie Point (°C.) |
|---|---|---|---|---|---|---|---|---|---|
| | XPb(Ni$_\frac{1}{3}$Nb$_\frac{2}{3}$)O$_3$—YPbTiO$_3$—ZPbZrO$_3$ + C | | | | | | | | |
| 1 | 15 | 45 | 40 | Sb$_2$O$_3$ | 0.5 | 7.70 | 1920 | 469 | 300 |
| 2 | 24 | 42 | 34 | Sb$_2$O$_3$ | 0.5 | 7.92 | 2800 | 571 | 260 |
| 3 | 35 | 35 | 30 | Sb$_2$O$_3$ | 0.5 | 7.94 | 3350 | 546 | 200 |
| 4 | 45 | 35 | 20 | Sb$_2$O$_3$ | 0.5 | 8.01 | 4620 | 580 | 165 |
| 5 | 5 | 50 | 45 | Sb$_2$O$_3$ | 0.5 | 7.22 | 1530 | 320 | 340 |
| 6 | 55 | 30 | 15 | Sb$_2$O$_3$ | 0.5 | 8.02 | 6770 | 482 | 120 |
| 7 | 24 | 32 | 44 | Sb$_2$O$_3$ | 0.5 | 7.78 | 2560 | 420 | 230 |
| 8 | 30 | 32 | 38 | Sb$_2$O$_3$ | 0.5 | 7.80 | 2760 | 448 | 210 |
| 9 | 30 | 45 | 25 | Sb$_2$O$_3$ | 0.5 | 7.81 | 2890 | 457 | 240 |
| 10 | 40 | 30 | 30 | Sb$_2$O$_3$ | 0.5 | 7.90 | 3270 | 497 | 180 |

TABLE-continued

| Sample No. | X (mol %) | Y (mol %) | Z (mol %) | C (weight %) | | Sintered Density (g/cm³) | Specific Inductive Capacity | Piezo-electric Constant ($\times 10^{-12}$ m/V) | Curie Point (°C.) |
|---|---|---|---|---|---|---|---|---|---|
| 11 | 45 | 30 | 25 | $Sb_2O_3$ | 0.5 | 7.96 | 4040 | 540 | 170 |
| 12 | 40 | 40 | 20 | $Sb_2O_3$ | 0.5 | 7.91 | 3960 | 530 | 190 |
| 13 | 22 | 23 | 55 | $Sb_2O_3$ | 0.5 | 7.50 | 1630 | 375 | 210 |
| 14 | 22 | 55 | 23 | $Sb_2O_3$ | 0.5 | 7.56 | 1690 | 382 | 300 |
| 15 | 40 | 23 | 37 | $Sb_2O_3$ | 0.5 | 7.73 | 1700 | 410 | 150 |
| 16 | 40 | 47 | 13 | $Sb_2O_3$ | 0.5 | 7.77 | 1670 | 391 | 210 |
| 17 | 10 | 48 | 42 | $Sb_2O_3$ | 0.5 | 7.53 | 1720 | 402 | 320 |
| 18 | 17 | 30 | 53 | $Sb_2O_3$ | 0.5 | 7.51 | 1700 | 398 | 250 |
| 19 | 51 | 24 | 25 | $Sb_2O_3$ | 0.5 | 7.89 | 3880 | 530 | 160 |
| 20 | 50 | 35 | 15 | $Sb_2O_3$ | 0.5 | 7.87 | 3790 | 420 | 170 |
| 21 | 31 | 48 | 21 | $Sb_2O_3$ | 0.5 | 7.60 | 2230 | 406 | 240 |
| 22 | 24 | 42 | 34 | $Sb_2O_3$ | 0.1 | 7.83 | 2430 | 462 | 270 |
| 23 | 24 | 42 | 34 | $Sb_2O_3$ | 1.0 | 7.94 | 2830 | 527 | 260 |
| 24 | 24 | 42 | 34 | $Sb_2O_3$ | 2.0 | 7.89 | 2990 | 410 | 250 |
| 25 | 24 | 42 | 34 | $Sb_2O_3$ | 0 | 7.68 | 2110 | 428 | 270 |
| 26 | 24 | 42 | 34 | $Sb_2O_3$ | 2.5 | 7.78 | 3120 | 365 | 250 |
| 27 | 24 | 42 | 34 | $Nb_2O_5$ | 0.5 | 7.90 | 2780 | 552 | 260 |
| 28 | 24 | 42 | 34 | $Bi_2O_3$ | 0.5 | 7.89 | 2770 | 570 | 260 |
| 29 | 24 | 42 | 34 | $aO_3$ | 0.5 | 7.93 | 2780 | 571 | 260 |
| 30 | 24 | 42 | 34 | $La_2O_3$ | 0.5 | 7.91 | 2830 | 563 | 260 |
| 31 | 24 | 42 | 34 | $WO_3$ | 0.5 | 7.88 | 2760 | 560 | 260 |
| 32 | 24 | 42 | 34 | $Sb_2O_3$ $La_2O_3$ | 0.25 0.25 | 7.92 | 2810 | 573 | 260 |
| 33 | 24 | 42 | 34 | $Sb_2O_3$ $Bi_2O_3$ $WO_3$ | 0.2 0.2 0.2 | 7.90 | 2810 | 568 | 260 |
| 34 | 24 | 42 | 34 | $TaO_3$ $La_2O_3$ $WO_3$ | 0.2 0.2 0.2 | 7.90 | 2800 | 573 | 260 |
| | | | | $ZPb(Ni_{\frac{1}{3}}Nb_{\frac{2}{3}})O_3$—$YPbTiO_3$—$XPbZrO_3 + C$ | | | | | |
| 35 | 24 | 42 | 34 | $Sb_2O_3$ $Nb_2O_5$ $Bi_2O_3$ $TaO_3$ $La_2O_3$ $WO_3$ | 0.1 0.1 0.1 0.1 0.1 0.1 | 7.89 | 2790 | 570 | 300 |
| 36 | 24 | 42 | 34 | $Sb_2O_3$ $Bi_2O_3$ $TaO_3$ $La_2O_3$ $WO_3$ | 0.1 0.1 0.1 0.1 0.1 | 7.90 | 2780 | 568 | 260 |
| 37 | 24 | 42 | 34 | $Sb_2O_3$ $Nb_2O_3$ $Bi_2O_3$ $TaO_3$ $La_2O_3$ | 0.1 0.1 0.1 0.1 0.1 | 7.90 | 2800 | 566 | 260 |
| | | | | $XPb(Ni_{\frac{1}{3}}Nb_{\frac{2}{3}})O_3$—$YPbTiO_3$—$ZPbZrO_3 + C$ | | | | | |
| 38 | 24 | 42 | 34 | $MnO_2$ | 0.5 | 7.90 | 1850 | 388 | 260 |
| 39 | 24 | 42 | 34 | $Fe_2O_3$ | 0.5 | 7.86 | 1790 | 368 | 260 |

What is claimed is:

1. A piezoelectric ceramic material consisting of a ternary solid solution of $Pb(Ni_{\frac{1}{3}}Nb_{\frac{2}{3}})O_3$-$PbTiO_3$-$PbZrO_3$ having the composition within an area encircled by lines connecting points:
A(15 mol% of $Pb(Ni_{\frac{1}{3}}Nb_{\frac{2}{3}})O_3$, 45 mol% of $PbTiO_3$ and 40 mol% of $PbZrO_3$),
F(40 mol% of $Pb(Ni_{\frac{1}{3}}Nb_{\frac{2}{3}})O_3$, 30 mol% of $PbTiO_3$ and 30 mol% $PbZrO_3$),
C(51 mol% of $Pb(Ni_{\frac{1}{3}}Nb_{\frac{2}{3}})O_3$, 24 mol% of $PbTiO_3$ and 25 mol% of $PbZrO_3$,
G(45 mol% of $Pb(Ni_{\frac{1}{3}}Nb_{\frac{2}{3}})O_3$, 35 mol% $PbTiO_3$ and 20 mol% of $PbZrO_3$,
H(40 mol% of $Pb(Ni_{\frac{1}{3}}Nb_{\frac{2}{3}})O_3$, 40 mol% of $PbTiO_3$ and 20 mol% of $PbZrO_3$) and
I(30 mol% of $Pb(Ni_{\frac{1}{3}}Nb_{\frac{2}{3}})O_3$, 45 mol% of $PbTiO_3$, and 25 mol% of $PbZrO_3$); and
$Sb_2O_3$ as an additive in an amount of 0.1 to 1.0 weight % of the ternary solid solution,
said piezoelectric ceramic material having a piezoelectric constant of not less than $450 \times 10^{-12}$ m/V.

2. A piezoelectric ceramic material according to claim 1, wherein the composition of the ternary solid solution is about 24 mol% of $Pb(Ni_{\frac{1}{3}}Nb_{\frac{2}{3}})O_3$, about 42 mol% of $PbTiO_3$ and about 34 mol% of $PbZrO_3$.

3. A piezoelectric ceramic material according to claim 1, wherein the at least one additive is added to the ternary solid solution in an amount of about 0.5 weight%.

4. A piezoelectric ceramic material according to claim 1, wherein said piezoelectric ceramic material has a Curie point of not less than 160° C.

5. A piezoelectric ceramic material according to claim 1, wherein said piezoelectric ceramic material has a sintered density of not less than 7.70 g/cm³.

6. A piezoelectric ceramic material consisting of a ternary solid solution of $Pb(Ni_{\frac{1}{3}}Nb_{\frac{2}{3}})O_3$-$PbTiO_3$-$PbZrO_3$ having the composition within an area encircled by lines connecting points:
C(51 mol% of $Pb(Ni_{\frac{1}{3}}Nb_{\frac{2}{3}})O_3$, 24 mol% of $PbTiO_3$ and 25 mol% of $PbZrO_3$),
G(45 mol% of $Pb(Ni_{\frac{1}{3}}Nb_{\frac{2}{3}})O_3$, 35 mol% $PbTiO_3$ and 20 mol% of $PbZrO_3$), H(40 mol% of Pb(Ni⅓Nb⅔)O₃, 40 mol% of PbTiO₃ and 20 mol% of PbZrO₃), J(24 mol% of Pb(Ni⅓Nb⅔)O₃, 42 mol% of PbTiO₃ and 34 mol% of PbZrO₃), K(35 mol% of Pb(Ni⅓Nb⅔)O₃, 35 mol% of PbTiO₃ and 30 mol% of PbZrO₃); and Sb₂O₃ as an additive in an amount of 0.5 to 1.0 weight % of the ternary solid solution, said piezoelectric ceramic material having a piezoelectric constant of not less than $500 \times 10^{-12}$ m/V.

7. A piezoelectric ceramic material according to claim 6 wherein the composition of the ternary solid solution is about 24 mol% of Pb(Ni⅓Nb₁₇₀)O₃, about 42 mol% of PbTiO₃ and about 34 mol% of PbZrO₃.

8. A piezoelectric ceramic material according to claim 6 wherein at least one additive is added to the ternary solid solution in an amount greater than 0.5 wt.%.

9. A piezoelectric ceramic material according to claim 6, wherein said piezoelectric ceramic material has a Curie point of not less than 160° C.

10. A piezoelectric ceramic material according to claim 6, wherein said piezoelectric ceramic material has a sintered density of not less than 7.70 g/cm³.

* * * * *